United States Patent
Deng

(10) Patent No.: US 10,483,162 B2
(45) Date of Patent: Nov. 19, 2019

(54) SEMICONDUCTOR STRUCTURE OF INTERCONNECT AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Hao Deng, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 15/936,766

(22) Filed: Mar. 27, 2018

(65) Prior Publication Data

US 2018/0286747 A1    Oct. 4, 2018

(30) Foreign Application Priority Data

Mar. 29, 2017  (CN) .......................... 2017 1 0197890

(51) Int. Cl.
| | | |
|---|---|---|
| H01L 21/768 | (2006.01) | |
| H01L 23/532 | (2006.01) | |
| H01L 21/285 | (2006.01) | |
| H01L 21/288 | (2006.01) | |
| C23F 17/00 | (2006.01) | |
| C23C 16/34 | (2006.01) | |
| C23C 16/455 | (2006.01) | |
| C23C 14/06 | (2006.01) | |
| H01L 23/522 | (2006.01) | |
| C23C 16/04 | (2006.01) | |

(Continued)

(52) U.S. Cl.
CPC .... *H01L 21/76846* (2013.01); *C23C 14/0641* (2013.01); *C23C 16/045* (2013.01); *C23C 16/34* (2013.01); *C23C 16/45531* (2013.01); *C23F 17/00* (2013.01); *C25D 7/123* (2013.01); *H01L 21/2855* (2013.01); *H01L 21/2885* (2013.01); *H01L 21/28556* (2013.01); *H01L 21/7684* (2013.01); *H01L 21/76802* (2013.01); *H01L 21/76879* (2013.01); *H01L 23/5226* (2013.01); *H01L 23/53238* (2013.01); *C25D 3/38* (2013.01); *H01L 23/5329* (2013.01)

(58) Field of Classification Search
None
See application file for complete search history.

(56) References Cited

U.S. PATENT DOCUMENTS

| | | | | |
|---|---|---|---|---|
| 8,486,832 B2* | 7/2013 | Morinaga | ......... | H01L 21/76843 257/E21.584 |
| 8,962,478 B1* | 2/2015 | Zhang | ............... | H01L 21/76879 438/653 |

(Continued)

*Primary Examiner* — Andres Munoz
(74) *Attorney, Agent, or Firm* — Anova Law Group, PLLC

(57) ABSTRACT

A semiconductor structure and a fabrication method are provided. The fabrication method includes: providing a substrate; forming a dielectric layer with an opening on the substrate; forming a first barrier layer on sidewall and bottom surfaces of the opening, the first barrier layer being doped by manganese; and forming a metal interconnect on the first barrier layer, the metal interconnect being located within the opening.

18 Claims, 4 Drawing Sheets

(51) Int. Cl.
*C25D 7/12* (2006.01)
*C25D 3/38* (2006.01)

(56) References Cited

U.S. PATENT DOCUMENTS

| | | | | |
|---|---|---|---|---|
| 2010/0038787 A1* | 2/2010 | Arai | ............... | H01L 21/76825 |
| | | | | 257/751 |
| 2013/0140698 A1* | 6/2013 | Lakshmanan | ..... | H01L 21/76843 |
| | | | | 257/751 |
| 2013/0292806 A1* | 11/2013 | Ma | ............... | H01L 29/06 |
| | | | | 257/632 |
| 2014/0070418 A1* | 3/2014 | Cabral, Jr. | ........ | H01L 23/53238 |
| | | | | 257/751 |
| 2014/0273436 A1* | 9/2014 | Hintze | ............... | H01L 21/76856 |
| | | | | 438/653 |
| 2015/0130063 A1* | 5/2015 | Zhang | ............... | H01L 21/76879 |
| | | | | 257/751 |

* cited by examiner

SEMICONDUCTOR STRUCTURE OF INTERCONNECT AND FABRICATION METHOD THEREOF

CROSS-REFERENCES TO RELATED APPLICATIONS

This application claims the priority of Chinese patent application No. 201710197890.3, filed on Mar. 29, 2017, the entirety of which is incorporated herein by reference.

FIELD OF THE DISCLOSURE

The present disclosure generally relates to the field of semiconductor manufacturing technologies and, more particularly, relates to a semiconductor structure and a fabrication method thereof.

BACKGROUND

With the development of semiconductor technologies, the integration degree of ultra-large-scale integrated circuits has been developed to include as many as hundreds of millions or even billions of device units, and a multi-layer (more than two layers) metal interconnection technology has been widely used. Conventionally, the metal interconnect is made of aluminum metal. However, as the feature size of the device in an integrated circuit chip continues to decrease and the circuit density in a metal interconnect continues to increase, the response time needs to be reduced and the conventional aluminum interconnects are no longer meet requirements. As such, the copper interconnects have gradually replaced the aluminum interconnects. Compared with the aluminum metal, the copper metal has a lower electrical resistivity and a higher resistance to electromigration, to reduce the resistance capacitance (RC) delay of the interconnects and improve the electromigration and enhance device stability.

However, the copper interconnects also have drawbacks. The copper metal has a high mobility, and copper can diffuse very fast in silicon and silicon oxides and most dielectrics. Once copper is introduced into the semiconductor substrate or the dielectric layer, the lifetime of the minority carriers in a device will be affected, causing a leakage current and an increase in the electromigration of the interconnection structure. As a result, circuit failure may occur, and the reliability is reduced. One solution is to form a barrier layer on the substrate before forming the copper interconnect, which can refrain the diffusion of copper to a certain extent.

However, the barrier performance of the barrier layer against copper diffusion in a copper interconnect is relatively week, and copper can easily diffuse into the dielectric layer, deteriorating the performance of the dielectric layer. The disclosed semiconductor structure and fabrication method are directed to solve one or more problems set forth above and other problems in the art.

BRIEF SUMMARY OF THE DISCLOSURE

One aspect of the present disclosure includes a method of fabricating a semiconductor structure. The fabrication method includes: providing a substrate; forming a dielectric layer with an opening on the substrate; forming a first barrier layer on sidewall and bottom surfaces of the opening, the first barrier layer being doped with manganese; and forming a metal interconnect on the first barrier layer, the metal interconnect being located within the opening.

Another aspect of the present disclosure includes a semiconductor structure. The semiconductor structure includes: a substrate; a dielectric layer with an opening on the substrate; a first barrier layer on sidewall and bottom surfaces of the opening, the first barrier layer being doped with manganese; and a metal interconnect on the first barrier layer, the metal interconnect being located within the opening.

Other aspects of the present disclosure can be understood by those skilled in the art in light of the description, the claims, and the drawings of the present disclosure.

DETAILED DESCRIPTION

Reference will now be made in detail to the exemplary embodiments of the disclosure, which are illustrated in the accompanying drawings. Wherever possible, the same reference numbers will be used throughout the drawings to refer to the same or similar parts.

Figure 1:
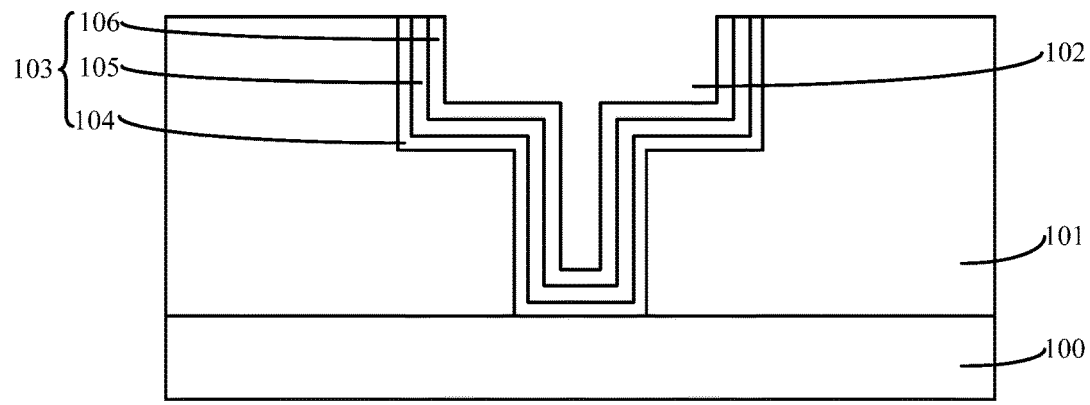
FIGS. 1 and 2 illustrate schematic structural views of a semiconductor structure corresponding to certain stages of the fabrication process.
Figure 2:
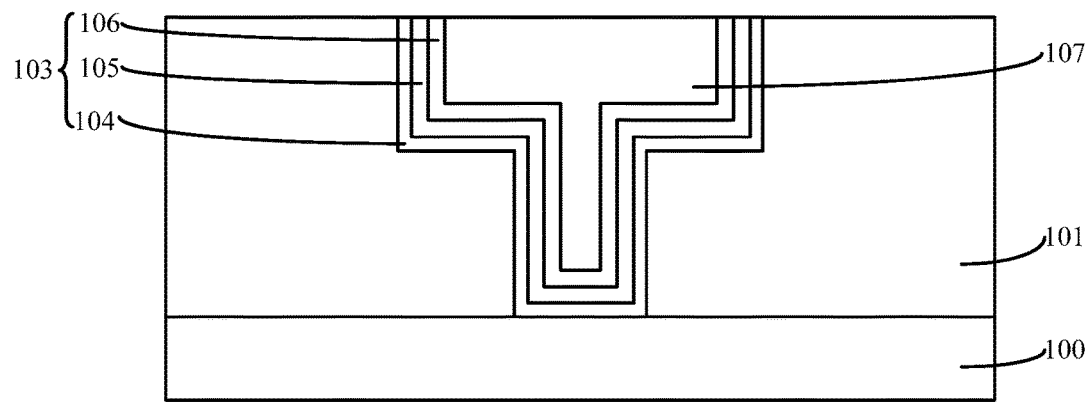

FIGS. 1 and 2 illustrate schematic structural views of a semiconductor structure corresponding to certain stages of the fabrication process.

As shown in FIG. 1, a substrate 100 is provided, and the substrate 100 includes a dielectric layer 101. The dielectric layer 101 has an opening 102, and a barrier layer structure 103 is formed on the sidewall and bottom surfaces of the opening 102.

As shown in FIG. 2, a metal interconnect 107 is formed on the top surface of the barrier layer structure 103.

In one embodiment, the metal interconnect 107 is made of a material including copper.

In the above conventional method, the barrier layer structure 103 is usually made of a material including tantalum nitride, and the tantalum nitride is formed by an atomic layer deposition process or a physical vapor deposition process. When the barrier layer structure 103 is formed by an atomic layer deposition process, the barrier layer structure 103 has a good step coverage on the sidewall and bottom of the opening 102. However, since the barrier layer formed by the atomic layer deposition process is not dense enough, the barrier layer structure 103 has a poor barrier performance against the copper atoms in the metal interconnect 107, such that the copper atoms can easily diffuse into the dielectric layer 101, thereby reducing the isolation performance of the dielectric layer 101.

When the barrier layer structure 103 is formed by a physical vapor deposition process, the barrier layer structure 103 has a high density and the barrier layer structure 103 has a good barrier performance against the copper atoms in the metal interconnect 107. However, the barrier layer structure 103 formed by the physical vapor deposition process has a poor step coverage on the sidewall and bottom of the opening 102, and therefore a gap exists between the barrier layer structure 103 and the sidewall of the opening 102 and between the barrier layer structure 103 and the bottom of the opening 102, which is not good for improving the performance of the interconnection structure.

In a conventional method to improve the step coverage of the barrier structure 103 to the opening 102 and the barrier performance of the barrier layer structure 103 against the copper atoms in the metal interconnect 107, the barrier layer structure 103 is a stacked structure, and the barrier layer structure 103 includes a first barrier layer 104 located on the sidewall and bottom of the opening 102, a second barrier layer 105 on the first barrier layer 104, and a third barrier layer 106 on the second barrier layer 105. The first barrier layer 104 is formed by an atomic layer deposition process, and therefore the first barrier layer 104 has a good step coverage to the sidewall and the bottom of the opening 102. The second barrier layer 105 and the third barrier layer 106 on the first barrier layer 104 are formed by a physical vapor deposition process, such that the second barrier layer 105 and the third barrier layer 106 are dense enough, and the second barrier layer 105 and the third barrier layer 106 have a good barrier performance against the copper atoms in the metal interconnect 107. Also, the third barrier layer 106 has a strong adherence, so that the interface between the third barrier layer 106 and the metal interconnect 107 is in a good state. As such, the barrier performance of the third barrier layer 106 against the copper ions in the metal interconnect 107 is even better.

However, as the integration degree of the semiconductor device increases, the ratio between the depth and width of the opening 102 gradually increases, making it more difficult to form the barrier layer structure 103 within the opening 102. The barrier performance of the formed barrier layer structure 103 is low, and the copper atoms in the metal interconnect 107 can easily diffuse into the dielectric layer 101. The isolation performance of the dielectric layer is relatively poor, which is not conducive to improve the performance of the semiconductor structure.

The present disclosure provides a semiconductor structure and the fabrication method thereof to increase the barrier performance of the barrier layer against the copper in the metal interconnect. The disclosed method includes: providing a substrate including a dielectric layer, with an opening in the dielectric layer; forming a first barrier layer doped with manganese on the sidewall and bottom surfaces of the opening; forming a metal interconnect on the first barrier layer, the metal interconnect being located within the opening.

In the disclosed method, the first barrier layer is doped with manganese, and a portion of the manganese can be easily diffused into the interface between the first barrier layer and the metal interconnect and at the grain boundaries within the metal interconnect. Thus, the metal atoms in the metal interconnect cannot easily diffuse along the grain boundary in the metal interconnect and along the interface between the first barrier layer and the metal interconnect, thereby reducing the electromigration rate of the metal atoms. The other portion of the manganese can be easily diffused into the interface between the first barrier layer and the dielectric layer and to the defects at the interface, reacting with the oxygen in the dielectric layer to form manganese oxide, such that the interface between the first barrier layer and the dielectric layer is in a good state and only very few defects are present, improving the barrier performance of the first barrier layer against the metal atoms in the metal interconnect.

Figure 6:
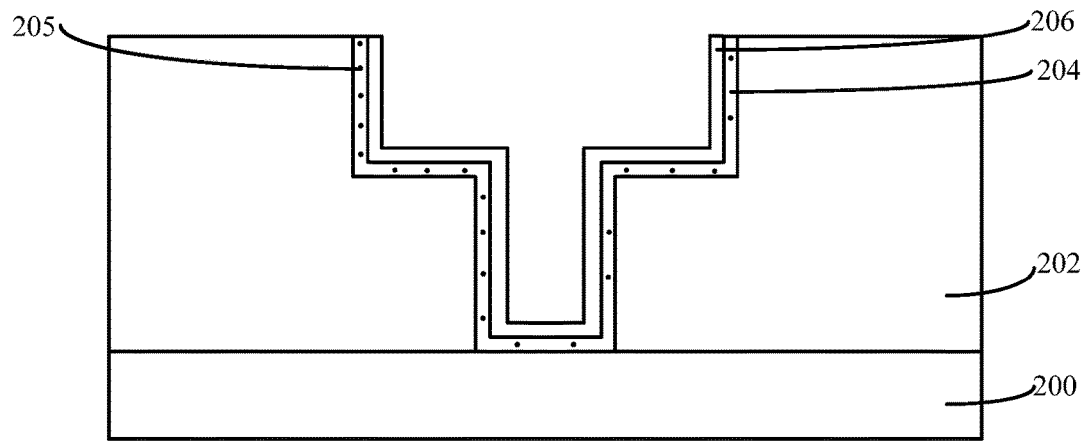
Figure 7:
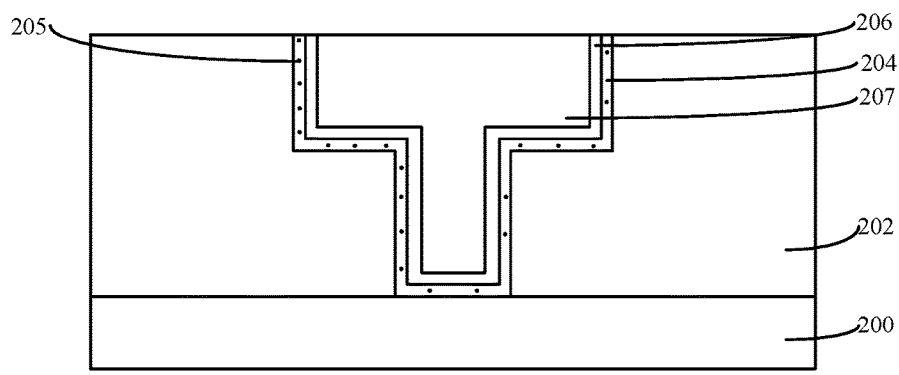
Figure 8:
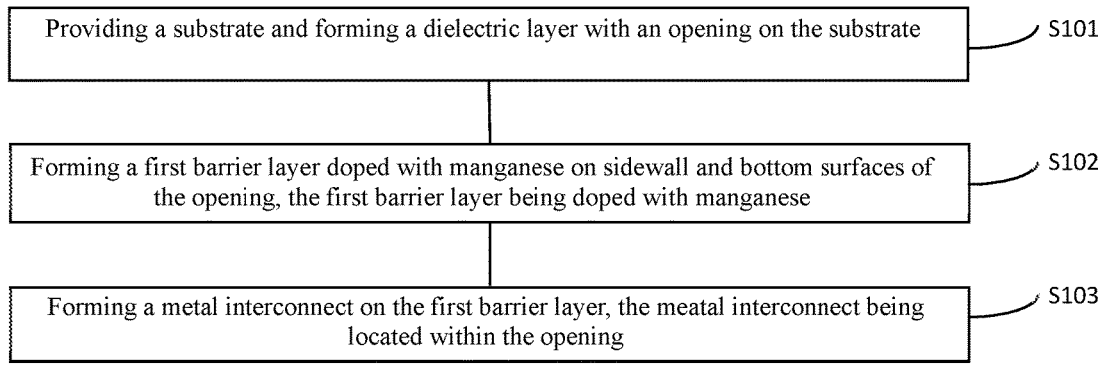
FIG. 8 illustrates an exemplary fabricating process of a semiconductor structure consistent with the disclosed embodiment.

FIG. 8 illustrates an exemplary fabrication process of a semiconductor structure consistent with various disclosed embodiments; and FIGS. 3-7 illustrate schematic structural views of a semiconductor structure corresponding to certain stages of the fabrication process consistent with various disclosed embodiments.

As shown in FIG. 8, at the beginning of the fabrication process, a substrate including a dielectric layer is provided (S101).

Figure 3:
FIGS. 3-7 illustrate schematic structural views of a semiconductor structure corresponding to certain stages of the fabrication process consistent with the disclosed embodiment.

As shown in FIG. 3, a substrate 200 is provided, and an initial dielectric layer 201 is formed on the substrate 200.

In one embodiment, the substrate 200 is made of a material including silicon. In other embodiments, the substrate may also be made of a semiconductor substrate, such as a germanium substrate, a silicon germanium substrate, a silicon-on-insulator substrate, a germanium-on-insulator substrate, or a silicon germanium-on-insulator substrate.

In other embodiments, a semiconductor device such as a MOS transistor is formed within the substrate.

In one embodiment, the initial dielectric layer 201 is a monolayer structure, and the initial dielectric layer 201 is made of a low-K dielectric material.

The low-K dielectric material refers to a dielectric material having a relative dielectric constant of less than 3.9. The low-K dielectric material is a porous material.

In one embodiment, the initial dielectric layer 201 is made of a material including SiCOH. In other embodiments, the initial dielectric layer may also be made of a material including fluorine-doped silica (FSG), boron-doped silica (BSG), phosphorus-doped silica (PSG), or boron phosphorous-doped silica (BPSG).

The method of forming the initial dielectric layer 201 includes a chemical vapor deposition process.

In other embodiments, the initial dielectric layer is a monolayer structure, and the initial dielectric layer is made of a material including silicon oxide.

In other embodiments, the initial dielectric layer is a stacked structure, and the initial dielectric layer includes a stop layer on the top surface of the substrate and a low-K dielectric layer on the stop layer.

An interconnection structure is then formed within the initial dielectric layer 201, and the initial dielectric layer 201 is made of a low-K dielectric material. The low-K dielectric material can reduce the capacitance between interconnects, decrease the time constant of interconnect in the interconnection structure, and reduce the delay of the circuit signal.

An opening is subsequently formed in the initial dielectric layer 201, and the opening may be a double damascene opening or a single damascene opening.

In one exemplary embodiment, the opening is a double damascene opening, and the double damascene opening includes a through hole and a trench in the through hole.

Figure 4:
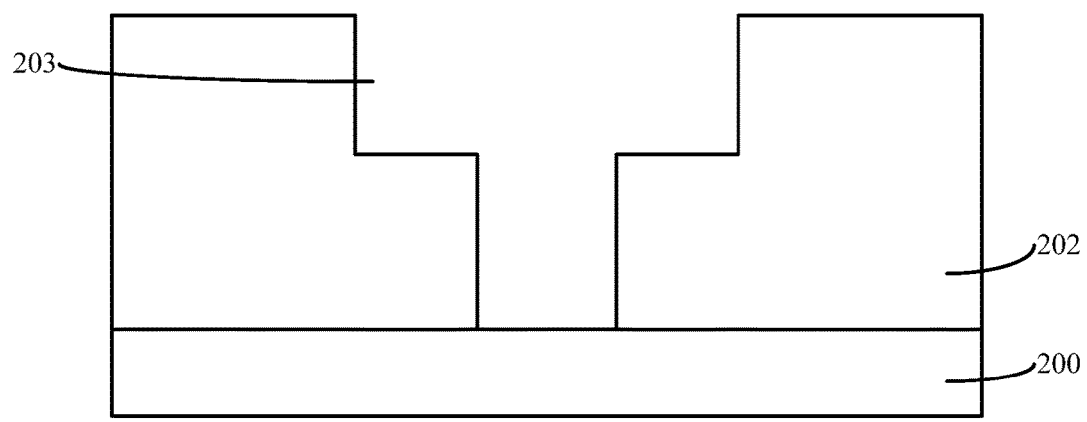

As shown in FIG. 4, a portion of the initial dielectric layer 201 is removed to form a dielectric layer 202, and an opening 203 is formed within the dielectric layer 202.

The ratio between the depth and width of the opening 203 is determined according to the process requirements.

The opening 203 includes a through hole (not indicated) located in the dielectric layer 202 and a trench (not indicated) located on the through hole.

In one embodiment, the through hole is formed after forming the trench. In other embodiments, the through hole may also be formed before forming the trench.

The process of forming the trench includes: forming a patterned first mask layer on the initial dielectric layer 201, and using the first mask layer as an etching mask to etch the initial dielectric layer 201, forming a trench.

In one embodiment, the process of etching the initial dielectric layer 201 includes a dry etching process.

The ratio between the depth and width of the trench is determined according to the process requirements.

In one embodiment, the first mask layer may be made of one or more of silicon oxide, silicon nitride, photoresist, and a metallic material, and the metallic material may include TiN, TaN, or WN.

The process of forming the through hole includes forming a second mask layer on the initial dielectric layer 201 and at the bottom surface of a portion of the trench, and the second mask layer exposing a portion of the bottom of the trench; using the second mask layer as an etching mask to etch the initial dielectric layer 201 until the top surface of the substrate 200 is exposed, forming a through hole.

The process of etching the initial dielectric layer 201 includes, for example, a dry etching process.

The ratio between the depth and width of the through hole is determined according to the process requirements.

In one embodiment, the second mask layer may be made of a material including silicon oxide, silicon nitride, photoresist or a metallic material, and the metallic material may include TiN, TaN, or WN.

After forming the through hole, the first mask layer and the second mask layer on the dielectric layer 202 and the second mask layer at the bottom of a portion of the trench are removed.

In one embodiment, the dielectric layer 202 is a monolayer structure, and the dielectric layer 202 may be made of a material including SiCOH. In other embodiments, the dielectric layer may also be made of a material including fluorine-doped silica (FSG), boron-doped silica (BSG), phosphorus-doped silica (PSG), boron phosphorous doped silica (BPSG).

In other embodiments, the dielectric layer is a monolayer structure, and the dielectric layer may be made of a material including silicon oxide.

Returning to FIG. 8, after providing the substrate, the fabrication method further includes forming a first barrier layer on the sidewall and the bottom surfaces of the opening (S102).

Figure 5:
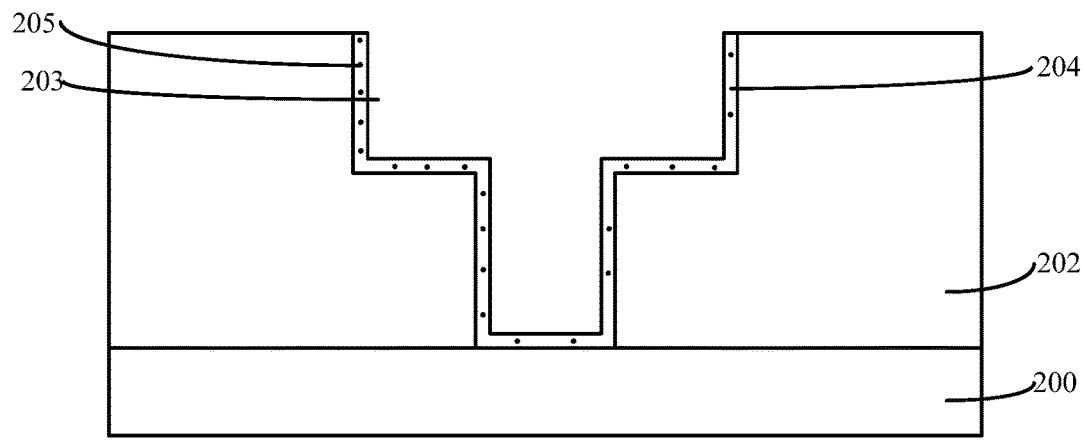

As shown in FIG. 5, a first barrier layer 204 is formed on the sidewall and bottom surfaces of the opening 203, and the first barrier layer 204 is doped with manganese 205.

In one embodiment, the first barrier layer 204 is made of a material including tantalum nitride.

The process of forming the first barrier layer 204 includes, for example, an atomic layer deposition process.

The process of forming the first barrier layer 204 includes: introducing a tantalum source gas to the substrate 200, with a portion of the tantalum source gas being adsorbed on the substrate 200; evacuating the tantalum source gas that is not adsorbed on the substrate 200; after removing the tantalum source gas that is not adsorbed on the substrate 200, a manganese source gas is introduced into the substrate 200, and a portion of the manganese source gas is adsorbed on the substrate 200; evacuating the manganese source gas that is not adsorbed on the substrate 200; after removing the manganese source gas that is not adsorbed on the substrate 200, a nitrogen source gas is introduced into the substrate 200, and a portion of the nitrogen source gas is adsorbed on the substrate 200; and evacuating the portion of the nitrogen source gas that is not adsorbed on the substrate 200.

The parameters of the atomic layer deposition process include: the tantalum source gas being $C_{10}H_{30}N_5Ta$, the flow rate of the tantalum source gas being in a range of approximately 500 standard ml/min~1500 standard ml/min; the manganese source gas being $(C_5H_5)_2Mn$, the flow rate of the manganese source gas being in a range of approximately 50 standard ml/min~150 standard ml/min; the nitrogen source gas being ammonia, and the flow rate of the nitrogen source gas being in a range of approximately 500 standard ml/min~2000 standard ml/min; the deposition temperature being in a range of approximately 250° C. to 350° C., and the pressure of the reaction chamber being in a range of approximately 2 Torr~10 Torr.

The first barrier layer 204 formed by the atomic layer deposition process has a good step coverage on the sidewall and the bottom of the opening 203. In the process of forming the first barrier layer 204 by the atomic layer deposition process, the damage to the dielectric layer 202 is minor, such that the dielectric layer 202 has a good performance on isolating different devices of the semiconductor, and the performance of the interconnection structure is improved, and thereby improving the performance of the semiconductor structure.

The thickness of the first barrier layer 204 is in a range of approximately 15 Å to 50 Å. If the thickness of the first barrier layer 204 is less than 15 Å, the first barrier layer 204 has a poor barrier performance against the copper atoms in the metal interconnects formed subsequently in the opening 203; if the thickness of the first barrier layer 204 is greater than 50 Å, when the top opening of the opening 203 has a constant size in an extended direction along the substrate 200, the thickness of the first barrier layer 204 is too large, such that the space for subsequently forming the metal interconnect is too small. It is difficult for the material that is used to subsequently form the metal interconnect to enter into the opening 203, and the material that is used to subsequently form the metal interconnect can be easily accumulate at the top of the opening 203. The subsequently formed metal interconnect has a poor density, resulting in a poor performance of the formed metal interconnect. This is not good for improving the performance of the interconnection structure and improving the performance of the semiconductor structure.

The first barrier layer 204 is formed by an atomic layer deposition process. The first barrier layer 204 is relatively thin, and the subsequent formation of the second barrier layer and the metal interconnect on the first barrier layer 204 will be very easy. The formed second barrier layer and the metal interconnect have good performance, and this is good for improving the performance of the semiconductor structure.

The first barrier layer 204 is doped with manganese 205, and the atomic percentage concentration of the manganese 205 is in a range of the barrier performance of 0.5% to 3%. If the atomic percentage concentration of the manganese 205 is less than 0.5%, the barrier performance of the first barrier layer 204 against the copper atoms in the subsequently formed metal interconnect is very weak, and the copper atoms can easily diffuse into the dielectric layer 202, thereby affecting the isolation performance of the dielectric layer 202; if the atomic percentage concentration of the manganese 205 is greater than 3%, the resistance of the first barrier layer 204 is increased, resulting in an increase of the power consumption, which is not conducive to improve the performance of the interconnection structure.

The first barrier layer 204 is doped with manganese 205, and therefore the first barrier layer 204 has a strong barrier effect on the copper atoms in the subsequently formed metal interconnect. A portion of the manganese 205 can be easily diffused into the interface between the first barrier layer 204 and the second barrier layer on the first barrier layer 204. As such, the metal atoms in the metal interconnect formed on the second barrier layer cannot be easily diffused along the interface between the first barrier layer 204 and the second barrier layer, thereby reducing the diffusion of the metal atoms into the first barrier layer 204 and the dielectric layer 202. The other portion of the manganese 205 can be easily diffused into the interface between the first barrier layer 204 and the dielectric layer 202 and to the interfacial defects, reacting with the oxygen in the dielectric layer 202 to form manganese oxide. Thus, the interface between the first barrier layer 204 and the dielectric layer 202 is in a good state and only few defects are present, reducing the diffusion of the metal atoms in the metal interconnect into the dielectric layer 202 and improving the isolation performance of the dielectric layer 202.

In one embodiment, after forming the first barrier layer 204, a second barrier layer is formed on the first barrier layer 204; after forming the second barrier layer, a metal interconnect is formed on the second barrier layer, and the metal interconnect is located within the opening 203.

In other embodiments, after forming the first barrier layer, a metal interconnect may also be formed directly on the first barrier layer.

As shown in FIG. 6, a second barrier layer 206 is formed on the first barrier layer 204.

The second barrier layer 206 can further prevent the metal atoms in the subsequently formed metal interconnect from diffusing into the dielectric layer 202.

The second barrier layer 206 is formed by a physical vapor deposition process. The process parameters of the physical vapor deposition process include a DC power of approximately 5000 W to 15,000 W, an AC bias power of approximately 200 W to 600 W, a flow rate of argon being in a range of 5 standard ml/min to 30 standard ml/min, and a pressure of approximately 15 mTor~60 mTorr.

The thickness of the second barrier layer 206 is in a range of 20 Å to 60 Å. If the thickness of the second barrier layer 206 is less than 20 Å, the barrier performance of the second barrier layer 206 against the metal atoms in the subsequently formed metal interconnect is not strong enough, and the metal atoms in the subsequently formed metal interconnect can be easily diffused into the dielectric layer 202. When the opening 203 (see FIG. 5) has a constant ratio between depth and width, if the thickness of the second barrier layer 206 is greater than 60 Å, it is difficult to subsequently form a metal interconnect on the second barrier layer 206. This results in poor performance of the formed metal interconnects and is not conducive to improve the performance of the semiconductor structure.

Returning to FIG. 8, the fabrication method further includes forming a metal interconnect on the first barrier layer (S103).

As shown in FIG. 7, a metal interconnect 207 is formed on the second barrier layer 206, and the top surface of the metal interconnect 207 is level with the top surface of the dielectric layer 202.

The process of forming the metal interconnect 207 includes: forming a metal layer on the top surfaces of the second barrier layer 206 and the dielectric layer 202; planarizing the metal layer until the top surface of the dielectric layer 202 is exposed to form a metal interconnect 207.

In one embodiment, the metal layer is a stacked structure, and the metal layer includes a seed layer (not illustrated) on the barrier layer 203 and a metal body layer on the seed layer.

The process of forming the metal body layer includes an electroplating method. The process of forming the metal body layer by electroplating includes transferring the substrate 200 to an electroplating cell; and electroplating to form a metal layer. The metal layer fills up the opening 203 and covers a portion of the top surface of the dielectric layer 202.

The electroplating cell has a plating solution, a metal copper anode, and positive and negative power supply electrodes.

The electroplating solution may include copper sulfate, sulfuric acid and water, and the plating solution may further include a plurality of additives such as a catalyst, an inhibitor and a conditioning agent.

The electroplating process includes the following processes: the seed layer is connected with the cathode of the power supply; the metal copper anode is connected with the anode of the power source; and the copper atoms located on the metal copper anode is oxidized to form metal copper ions; the metal copper ions on the surface of the seed layer undergoes a reduction reaction, and the resulting copper atoms are deposited onto the top surface of the seed layer, forming a metal layer.

The second barrier layer 206 is proximate to the metal interconnect 207. The second barrier layer 206 is formed by a physical vapor deposition process, and the second barrier layer 206 has a high density. As such, the second barrier layer 206 has a good barrier performance against the copper atoms in the metal interconnect 207. The copper atoms cannot easily be diffused into the second barrier layer 206, the first barrier layer 204, and the dielectric layer 202, thereby improving the isolation performance of the dielectric layer 202.

The first barrier layer 204 is doped with manganese 205. A portion of the manganese 205 can be easily diffused into the interface between the first barrier layer 205 and the second barrier layer 205, and thus the metal atoms in the metal interconnect 207 cannot be easily diffused at the interface between the first barrier layer 204 and the second barrier layer 206. As such, the diffusion of the copper atoms in the metal interconnect 207 into the first barrier layer 204 and the dielectric layer 202 is reduced, thereby improving the isolation performance of the dielectric layer 202. The other portion of the manganese 205 can be easily diffused into the interface between the first barrier layer 204 and the dielectric layer 202 and into the interfacial defects, and the manganese 205 can react with the oxygen in the dielectric layer 202 to form manganese oxide. The interface between the first barrier layer 204 and the dielectric layer 202 has a very good state and only very few defects are present, thereby further reducing the diffusion of the copper atoms in the metal interconnects 207 into the dielectric layer 202 and improving the isolation performance of the dielectric layer 202.

In addition, it is easy to form the metal interconnect 207, and the performance of the metal interconnect 207 is very good. The thickness of the first barrier layer 204 is in a range of approximately 15 Å to 50 Å, and the thickness of the second barrier layer 206 is in a range of approximately 20 Å to 60 Å. The second barrier layer 206 is located on the first barrier layer 204, and the first barrier layer 204 is located on the sidewall and bottom surfaces of the opening 203. The metal interconnect is located on the second barrier layer 206. Also, the first barrier layer 204 and the second barrier layer 206 are relatively thin. Therefore, when the opening 203 has a constant ratio between depth and width, there is a large space for forming the metal interconnect 207, such that the material used to form the metal interconnect 207 can easily enter into the opening. The formed metal interconnect 207 will be very dense and the metal interconnect 207 has better performance, thereby improving the performance of the interconnection structure.

As disclosed, the first barrier layer is doped with manganese. A portion of the manganese can be easily diffused to the interface between the first barrier layer and the metal interconnect and to the grain boundaries within the metal interconnect, such that the metal atoms in the metal interconnect cannot be easily diffused along the grain boundaries within the metal interconnect and at the interface between the first barrier layer and the metal interconnect, thereby reducing the electromigration rate of the metal atoms. The other portion of the manganese can be easily diffused into the interface between the first barrier layer and the dielectric layer and into the interfacial defects and react with the oxygen in the dielectric layer to form manganese oxide. Therefore, the interface between the first barrier layer and the dielectric layer is in a good state and only very few defects are present, improving the barrier performance of the first barrier layer against the metal atoms in the metal interconnect.

Accordingly, the present disclosure also provides a semiconductor structure formed by the disclosed fabrication method.

Compared with conventional technologies, the fabrication method provided in the disclosure is advantageous.

In the disclosed fabrication method of a semiconductor structure, the first barrier layer is doped with manganese. A portion of the manganese can be easily diffused into the interface between the first barrier layer and the metal interconnect and to the grain boundaries within the metal interconnect, such that the metal atoms in the metal interconnect cannot easily diffuse along the grain boundaries within the metal interconnect and at the interface between the first barrier layer and the metal interconnect, thereby reducing the diffusion of the metal atoms to the first barrier layer and the dielectric layer. The other portion of the manganese can easily diffuse into the interface between the first barrier layer and the dielectric layer and to the interfacial defects and react with the oxygen in the dielectric layer to form manganese oxide, making the interfacial state between the first barrier layer and the dielectric layer very good and only very few defects are present, improving the barrier performance of the first barrier layer against the metal atoms in the metal interconnect.

The thickness of the first barrier layer is in a range of approximately 15 Å to 50 Å. The first barrier layer 204 is located on the sidewall and bottom surfaces of the opening. The metal interconnect is located on the second barrier layer, and the first barrier is relatively thin. Therefore, when the opening has a constant ratio between depth and width, there is a large space for forming the metal interconnect, and thus the material used to form the metal interconnect can easily enter into the opening. The formed metal interconnect will have a high density and the metal interconnect 207 has better performance, thereby improving the performance of the interconnection structure.

The above detailed descriptions only illustrate certain embodiments of the disclosed disclosure, and are not intended to limit the scope of the disclosed disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method of forming a semiconductor structure, comprising:
   providing a substrate;
   forming a dielectric layer with an opening on the substrate;
   forming a first barrier layer on sidewall and bottom surfaces of the opening, wherein the first barrier layer is made of a material including tantalum nitride doped with manganese, the first barrier layer is formed by an atomic layer deposition process, and forming the first barrier layer comprises:
   introducing a tantalum source gas to the substrate, a portion of the tantalum source gas being adsorbed on the substrate;
   evacuating the tantalum source gas that is not adsorbed on the substrate;
   introducing a manganese source gas to the substrate, a portion of the manganese source gas being adsorbed on the substrate;
   evacuating the manganese source gas that is not adsorbed on the substrate;
   introducing a nitrogen source gas to the substrate, a portion of the nitrogen source gas being adsorbed on the substrate; and
   evacuating the nitrogen source gas that is not adsorbed on the substrate, wherein the atomic layer deposition process uses:
   the tantalum source gas including $C_{10}H_{30}N_5Ta$, with a flow rate in a range of approximately 500 standard ml/min~1500 standard ml/min;
   the manganese source gas including $(C_5H_5)_2Mn$, with a flow rate in a range of approximately 50 standard ml/min~150 standard ml/min;
   the nitrogen source gas including ammonia gas, with a flow rate in a range of approximately 500 standard ml/min~2000 standard ml min;
   a deposition temperature in a range of approximately 250° C.~350° C.; and
   a pressure in a reaction chamber in a range of approximately 2 Torr~10 Torr; and
   forming a metal interconnect on the first barrier layer, the metal interconnect being located within the opening.

2. The method according to claim 1, wherein:
   a thickness of the first barrier layer is in a range of approximately 15 Å to 50 Å.

3. The method according to claim 1, wherein:
   an atomic percentage concentration of manganese in the first barrier layer is in a range of 0.5% to 3%.

4. The method according to claim 1, wherein:
   the dielectric layer includes a single-layer structure; and
   the dielectric layer is made of a low-K dielectric material having a dielectric constant value of less than about 3.9.

5. The method according to claim 4, wherein:
   the dielectric layer is made of one or more of SiCOH, boron-doped silicon dioxide, phosphorus-doped silicon dioxide, and boron phosphorus-doped silicon dioxide.

6. The method according to claim 1, wherein forming the metal interconnect comprises:
   forming a metal layer on the first barrier layer; and
   planarizing the metal layer until a top surface of the dielectric layer is exposed, the planarized metal layer forming the metal interconnect.

7. The method according to claim 6, wherein:
   the metal layer is formed by an electroplating method.

8. The method according to claim 1, wherein:
   the metal interconnect is made of a material including copper.

9. The method according to claim 1, wherein:
forming a second barrier layer on a top surface of the first barrier layer is after forming the first barrier layer and before forming the metal interconnect.

10. The method according to claim 9, wherein:
the second barrier layer is made of a material including tantalum.

11. The method according to claim 9, wherein:
the second barrier layer is formed by a physical vapor deposition process.

12. The method according to claim 9, wherein:
a thickness of the second barrier layer is in a range of approximately 20 Å to 60 Å.

13. The method according to claim 1, wherein:
the second barrier layer is formed directly on the first barrier layer and is not doped with manganese.

14. A method of forming a semiconductor structure, comprising:
providing a substrate;
forming a dielectric layer with an opening on the substrate;
forming a first barrier layer on sidewall and bottom surfaces of the opening, the first barrier layer being doped with manganese;
forming a second barrier layer on a top surface of the first barrier layer after forming the first barrier layer and before forming a metal interconnect; and
forming the metal interconnect on the first barrier layer, the metal interconnect being located within the opening, wherein the second barrier layer is formed by a physical vapor deposition process and the physical vapor deposition process uses:
a DC power in a range of approximately 5,000 W to 15,000 W;
an AC bias power in a range of approximately 200 W to 600 W;
a flow rate of argon in a range of approximately 5 standard ml/min~30 standard ml/min; and
a pressure in a range of approximately 15 mTor~60 mTorr.

15. The method according to claim 14, wherein:
the first barrier layer is made of a material including tantalum nitride doped with manganese.

16. The method according to claim 15, wherein:
the first barrier layer is formed by an atomic layer deposition process, and
forming the first barrier layer comprises:
introducing a tantalum source gas to the substrate, a portion of the tantalum source gas being adsorbed on the substrate;
evacuating the tantalum source gas that is not adsorbed on the substrate;
introducing a manganese source gas to the substrate, a portion of the manganese source gas being adsorbed on the substrate;
evacuating the manganese source gas that is not adsorbed on the substrate;
introducing a nitrogen source gas to the substrate, a portion of the nitrogen source gas being adsorbed on the substrate; and
evacuating the nitrogen source gas that is not adsorbed on the substrate.

17. The method according to claim 16, wherein the atomic layer deposition process uses:
the tantalum source gas including $C_{10}H_{30}N_5Ta$, with a flow rate in a range of approximately 500 standard ml/min~1500 standard ml/min;
the manganese source gas including $(C_5H_5)_2Mn$, with a flow rate in a range of approximately 50 standard ml/min~150 standard ml/min;
the nitrogen source gas including ammonia gas, with a flow rate in a range of approximately 500 standard ml/min~2000 standard ml min;
a deposition temperature in a range of approximately 250° C.~350° C.; and
a pressure in a reaction chamber in a range of approximately 2 Torr~10 Torr.

18. The method according to claim 14, wherein:
a thickness of the first barrier layer is in a range of approximately 15 Å to 50 Å.

* * * * *